United States Patent
Igarashi

(10) Patent No.: US 8,222,736 B2
(45) Date of Patent: Jul. 17, 2012

(54) SEMICONDUCTOR DEVICE WITH AL PAD

(75) Inventor: Takeshi Igarashi, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 37 days.

(21) Appl. No.: 12/054,087

(22) Filed: Mar. 24, 2008

(65) Prior Publication Data

US 2008/0230908 A1  Sep. 25, 2008

(30) Foreign Application Priority Data

Mar. 23, 2007  (JP) ................. 2007-075858

(51) Int. Cl.
*H01L 23/52* (2006.01)

(52) U.S. Cl. .. 257/734; 257/773; 257/786; 257/E23.021

(58) Field of Classification Search .......... 257/734–738, 257/750, 759, 773, 786, E23.021
See application file for complete search history.

(56) References Cited

U.S. PATENT DOCUMENTS

| | | | | |
|---|---|---|---|---|
| 4,388,512 A | * | 6/1983 | Salzer et al. | 219/56.22 |
| 4,880,708 A | * | 11/1989 | Sharma et al. | 428/620 |
| 5,173,762 A | * | 12/1992 | Ota | 257/666 |
| 5,362,926 A | * | 11/1994 | Fukuda et al. | 174/256 |
| 5,773,899 A | * | 6/1998 | Zambrano | 257/784 |
| 6,011,281 A | | 1/2000 | Nunokawa et al. | |
| 6,229,221 B1 | * | 5/2001 | Kloen et al. | 257/784 |
| 6,577,008 B2 | * | 6/2003 | Lam et al. | 257/750 |
| 6,897,570 B2 | * | 5/2005 | Nakajima et al. | 257/786 |
| 7,361,993 B2 | * | 4/2008 | Coolbaugh et al. | 257/758 |
| 2001/0019856 A1 | * | 9/2001 | Takahashi et al. | 438/127 |
| 2003/0230809 A1 | * | 12/2003 | Nakajima et al. | 257/758 |
| 2005/0040232 A1 | * | 2/2005 | Maloney | 235/385 |
| 2005/0116328 A1 | * | 6/2005 | Oi et al. | 257/678 |
| 2005/0121804 A1 | * | 6/2005 | Kuo et al. | 257/781 |
| 2006/0091537 A1 | * | 5/2006 | Suzuki | 257/734 |

FOREIGN PATENT DOCUMENTS

| | | |
|---|---|---|
| JP | 59-210656 A | 11/1984 |
| JP | 11-162996 A | 6/1999 |
| JP | 2006-173386 A | 6/2006 |

* cited by examiner

*Primary Examiner* — Thao Le
*Assistant Examiner* — Allen Parker
(74) *Attorney, Agent, or Firm* — Westerman, Hattori, Daniels & Adrian, LLP

(57) ABSTRACT

A semiconductor device includes: a pad that is formed on a semiconductor layer, contains Al, and has an interconnection portion that is formed outside a bonding area; an interconnection layer that contains Au and is electrically connected to the interconnection portion of the pad, an edge of the interconnection layer being formed outside of the bonding area; and a barrier layer that is provided between the interconnection portion and the interconnection layer.

16 Claims, 10 Drawing Sheets

SEMICONDUCTOR DEVICE WITH AL PAD

BACKGROUND OF THE INVENTION

1. Field of the Invention

The present invention generally relates to a semiconductor device, and more particularly, to a semiconductor device that has an interconnection layer containing Au and a bonding pad containing Al.

2. Description of the Related Art

A semiconductor device having a silicon substrate is commonly used as a high-power semiconductor device that is used for an inverter, a converter, or a switch of a switching regulator. In such a semiconductor device, which is usually provided as a semiconductor chip, a large amount of current flows through the bonding wires connected to the semiconductor chip, and therefore, the bonding wires are made of Al (aluminum) having low resistivity. Meanwhile, the interconnection layer and the bonding pad formed on a semiconductor chip having a silicon substrate is typically made of Al. As a result, bonding wires containing Al as a main component (hereinafter referred to as Al wires) are bonded to a bonding pad containing Al as a main component (hereinafter referred to as an Al pad).

In recent years, high-power semiconductor devices each having a III-V compound semiconductor layer containing GaN (gallium nitride) or the like are being developed. In a semiconductor chip having a III-V compound semiconductor layer, an interconnection layer containing Au (gold) as a main component (hereinafter referred to as an Au interconnection layer) is employed. This is because electrodes containing Au are employed as the ohmic electrodes in contact with the semiconductor layer or the electrodes such as gate electrodes.

Al and Au react with each other when the temperature reaches approximately 200° C., and form an intermetallic compound. Since this compound has high resistivity, the electric resistance at the contact portion between Al and Au becomes higher. This problem is known as "purple plague" (generation of $AuAl_2$). To counter this problem, when a bonding wire containing Au as a main component (an Au wire) is connected to an interconnection layer containing Al as a main component (an Al interconnection layer), a pad containing Au as a main component (an Au pad) is formed on the Al interconnection layer, with a barrier layer being interposed in between, and the Au wire is connected onto the Au pad, as disclosed in Japanese Unexamined Patent Publication No. 59-210656. Also, a barrier layer can be formed between an Al interconnection layer and an Au interconnection layer, as disclosed in Japanese Unexamined Patent publication Nos. 11-162996 and 2006-173386. With this arrangement, a reaction between Al and Au can be prevented.

However, in a case where an Al pad 70 is formed on an Au layer 34 (an Au interconnection layer) formed on a substrate 10 of a compound semiconductor, with a barrier layer 72 being interposed between the Al pad 70 and the Au layer 34, and an Al wire 40 is connected to the Al pad 70, as shown in FIG. 1, a reaction between Al and Au is caused as will be described later.

SUMMARY OF THE INVENTION

It is therefore an object of the present invention to provide a semiconductor device in which the above disadvantage is eliminated.

A more specific object of the present invention is to provide a semiconductor device in which a reaction between the Al pad and the Au interconnection layer can be prevented by forming bonding wires on the Al pad.

According to an aspect of the present invention, there is provided a semiconductor device including: a pad that is formed on a semiconductor layer, contains Al, and has an interconnection portion that is formed outside a bonding area; an interconnection layer that contains Au and is electrically connected to the interconnection portion of the pad, an edge of the interconnection layer being formed outside of the bonding area; and a barrier layer that is provided between the interconnection portion and the interconnection layer.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
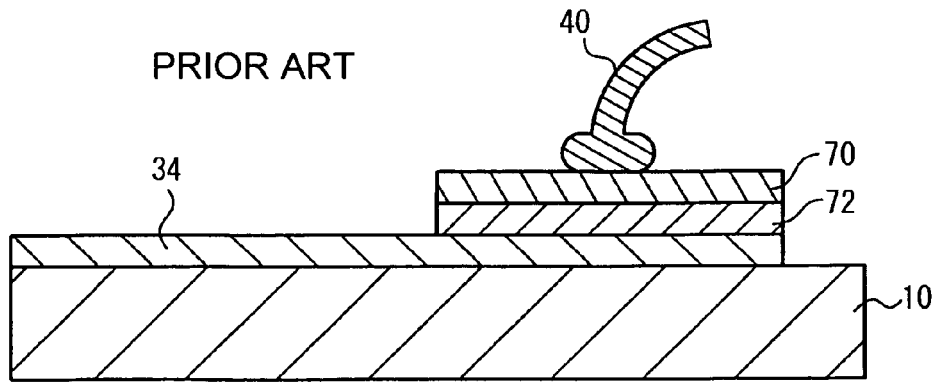
FIG. 1 is a cross-sectional view of a pad structure of a comparative example.

First, the cause of a reaction between the Al pad 70 and the Au layer 34 in the structure shown in FIG. 1 was examined. The results of the examination showed that the barrier layer 72 was damaged when the Al wire 40 was wire-bonded to the Al pad 70. When wire bonding is performed, each bonding wire and a pad are mechanically and electrically connected to each other by virtue of the heat applied onto the semiconductor chip and the ultrasonic energy and pressure applied by the bonding tool onto the pad. When an Au wire is bonded to an Au pad, heat and ultrasonic energy mainly contribute to the bonding (thermosonic bonding). When an Al wire is bonded to an Al pad, pressure mainly contributes to the bonding. Therefore, in a case where Al wires are employed, a higher pressure is required than in a case where Au wires are employed. This is considered to be the reason that the barrier layer is damaged in a structure in which a pad is formed on an interconnection layer, with the barrier layer being interposed in between, as disclosed in Japanese Unexamined Patent Publication No. 59-210656. The following is a description of example structures for preventing damage to the barrier layer.

First Embodiment

Figure 2:
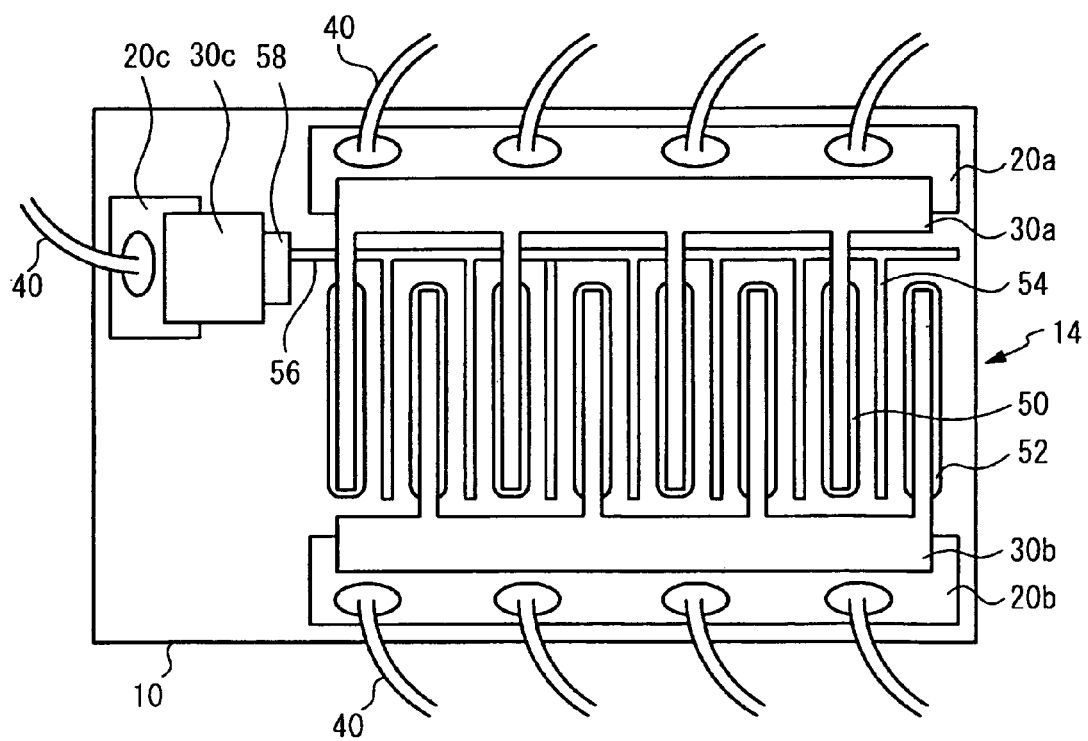
FIG. 2 is a plan view of a semiconductor chip in accordance with a first embodiment of the present invention.

A first embodiment of the present invention is an example of a FET (Field Effect Transistor) that contains GaN. FIG. 2 is a plan view of a semiconductor chip of a semiconductor device in accordance with the first embodiment. A GaN-based semiconductor layer containing GaN is formed on a substrate 10 such as a sapphire substrate, a SiC (silicon carbide) substrate or a Si substrate. Source electrodes 50 and drain electrodes 52 that are made of Al/Ti (titanium) are formed on the GaN-based semiconductor layer, and gate electrodes 54 made of Au/Ni (nickel) are further formed. The source electrodes 50, the drain electrodes 52, and the gate electrodes 54 form fingers. An FET 14 is formed with the fingers, and has a multi-finger structure. Interconnection layers 30a and 30b are formed for the source electrodes 50 and the drain electrodes 52, respectively. The interconnection layers 30a and 30b each have a comb-like shape, and the fingers are connected to bus bars. The bus bar of the interconnection layer 30a extends on an Al pad 20a, so that the interconnection layer 30a and the Al pad 20a are electrically connected to each other. The same applies to the interconnection layer 30b and an Al pad 20b. Each of the gate electrodes 54 is connected to a gate pad 58 via a bus bar 56. The gate pad 58 and an Al pad 20c are connected to each other via an interconnection layer 30c. Each of the interconnection layers 30a through 30c is formed with a barrier layer and an Au layer. One or more of Al wires 40 are connected to each of the Al pads 20a through 20c.

Figure 3A:
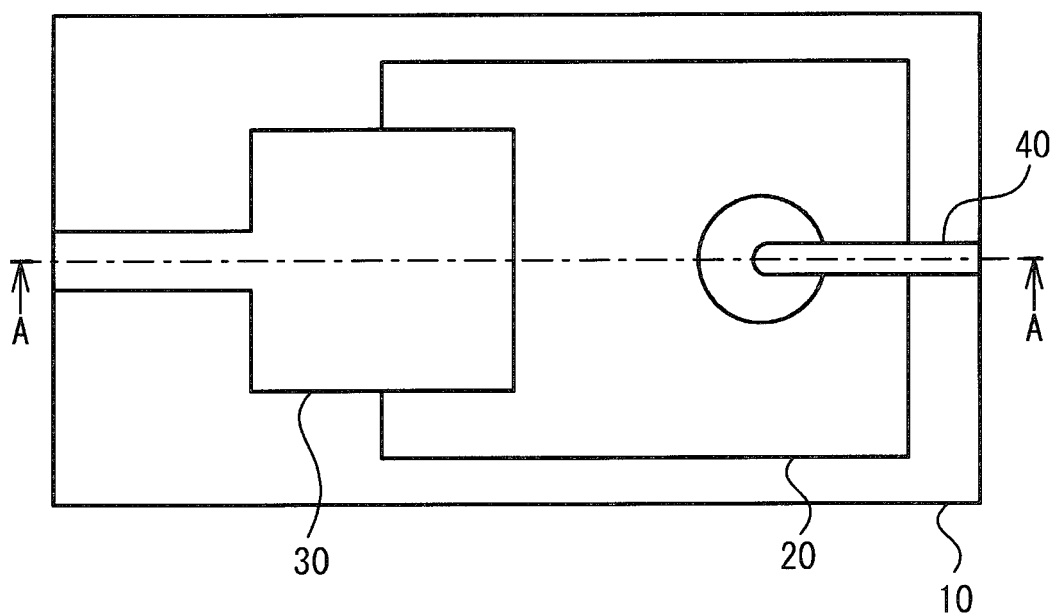
FIG. 3A is a plan view of a pad structure in accordance with the first embodiment.
Figure 3B:
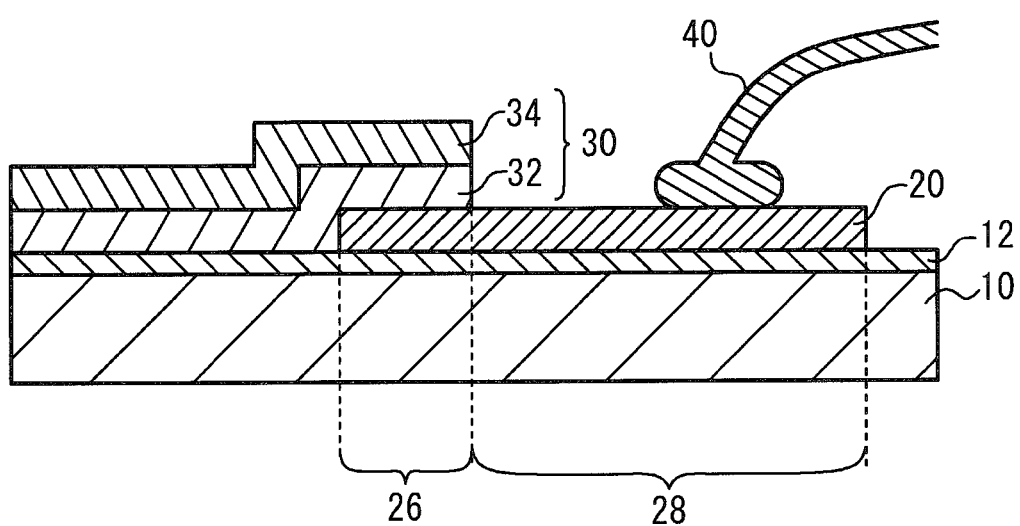
FIG. 3B is a cross-sectional view of the pad structure, taken along the line A-A of FIG. 3A.

FIGS. 3A and 3B are a plan view and a cross-sectional view of a pad structure formed with an Al pad 20 and an interconnection layer 30 that are formed on the substrate 10. As shown in FIGS. 3A and 3B, a compound semiconductor layer 12 that is a GaN-based semiconductor layer is placed on the substrate 10. The compound semiconductor layer 12 may have a modulated composition, that is, it may have a graded composition or it may be composed of layered films of different compositions. The Al pad 20 and the interconnection layer 30 are formed on the compound semiconductor layer 12. Alternatively, the Al pad 20 and the interconnection layer 30 may be formed above the compound semiconductor layer 12, with an insulating film such as an interlayer insulating film or a protection film being interposed in between. Also, part of the Al pad 20 and the interconnection layer 30 may be placed directly on the substrate 10, without the compound semiconductor layer 12 being interposed in between. The interconnection layer 30 extends on the Al pad 20, so that the interconnection layer 30 and the Al pad 20 are electrically connected to each other.

The film thickness of the Al pad 20 is 2 μm, for example. An Al wire 40 with a diameter of 200 μm to 300 μm is connected onto the Al pad 20. The interconnection layer 30 is formed with a barrier layer 32 and an Au layer 34 (an interconnection layer containing Au; an Au interconnection layer) formed on the barrier layer 32. The barrier layer 32 is a TiN (titanium nitride) layer or a TiWN (titanium tungsten nitride) layer having a film thickness of 50 nm to 300 nm, more preferably 100 nm to 200 nm. Alternatively, the barrier layer 32 may be a WN (tungsten nitride) layer, a WSiN (tungsten silicide nitride) layer, a TaN (tantalum nitride) layer, or the like. If the film thickness of the barrier layer 32 is too small, the barrier properties become smaller, as thin portions are formed due to film thickness variations and the likes. If the film thickness of the barrier layer 32 is too large, the overetching time becomes long, and the base layer under the barrier layer 32 (the compound semiconductor layer 12 in the first embodiment) is damaged or etched. Also, the processing time becomes longer. Therefore, the film thickness of the barrier layer 32 is 50 nm to 300 nm, more preferably, 100 nm to 200 nm, for example. The film thickness of the Au layer 34 is 5 μm to 10 μm, for example.

In the first embodiment, the interconnection layer 30 is electrically connected to the Al pad 20 outside the area in which the Al wire 40 is connected to the Al pad 20. More specifically, the Al pad 20 has a bonding area 28 that is an area to which the Al wire 40 is connected, and an interconnection portion 26 to which the Au layer 34 is connected. The interconnection portion 26 is formed outside the bonding area 28. Since the Al wire 40 is connected to the Al pad 20 in this manner, an intermetallic reaction is not caused between the Al wire 40 and the Al pad 20. Also, the Al pad 20 and the interconnection layer 30 are connected to each other outside the bonding area 28 to which the Al wire 40 is connected. Accordingly, it is possible to prevent a reaction between the Al pad 70 and the Au layer 34 by the bonding of the Al wire 40 in the comparative example shown in FIG. 1. In this manner, a reaction between the Al pad 20 and the interconnection layer 30 due to the formation of the Al wire 40 on the Al pad 20 can be prevented.

The barrier layer 32 is also formed between the interconnection portion 26 of the Al pad 20 and the Au layer 34 (the Au interconnection layer). Accordingly, a reaction between the Al pad 20 and the interconnection layer 30 can be prevented in the area in which the Al pad 20 is in contact with the interconnection layer 30. Other than the above mentioned materials such as TiN and TiWN, the barrier layer 32 may be made of a material that can prevent a reaction between Al and Au. Also, it is possible to provide another conductive layer such as a contact layer between the barrier layer 32 and the Au layer 34 or under the barrier layer 32.

With the semiconductor device in accordance with the first embodiment, the maximum service temperature can be 200° C. or higher. It is known that the bond strength between an Al pad and an Au wire decreases at a temperature of 150° C. to 200° C. or higher due to purple plague. It is considered that the same will happen in a case where an Al wire is bonded to an Au pad. Therefore, when the maximum service temperature of the semiconductor device is 200° C. or higher, the pad structure in accordance with the first embodiment is effective. The maximum service temperature is the temperature that is set for each semiconductor device and guarantees high reliability when the semiconductor device is in operation.

If there are impurities existing at the contact portion between Al and Au, the generation of an intermetallic compound of Al and Au is accelerated. When a semiconductor chip is encapsulated with plastic, the glass transition temperature of the encapsulating plastic is generally 150° C. to 200° C. If the temperature becomes higher than the glass transition temperature, the thermal expansion coefficient of the encapsulating plastic becomes larger. As a result, a gap is formed between the plastic and the semiconductor chip at a temperature of 150° C. to 200° C. The oxygen entering the gap oxidizes the encapsulating plastic, and the contact product of the oxide is supplied as the impurities to the contact portion between Al and Au. As described above, in a semiconductor device encapsulated with plastic, a reaction between Al and Au is easily caused when the maximum service temperature is 200° C. or higher. Therefore, the pad structure in accordance with the first embodiment is particularly effective.

Further, in a semiconductor device for high-power application, the amount of current to be supplied is large, and the heat production rate is large. As a result, the service environmental temperature is substantially 200° C. or higher. Therefore, for a semiconductor device for high-power application, the structure in accordance with the first embodiment is preferred.

Meanwhile, it is preferable that the diameter of the Al wire 40 is 100 μmΦ or greater. An Al wire to be used in a semiconductor device for high-power application is called a "thick wire" for supplying a large amount of current. An Al wire to be used in a semiconductor device not for high-power application has a diameter of 50 μmΦ or smaller, and has a different purpose of use from a thick wire. In a case where the Al wire 40 is thick in FIG. 1, the pressure to be applied onto the Al pad 70 becomes high at the time of wire bonding. Therefore, the barrier layer 72 easily breaks where a thick wire is employed, and the pad structure in accordance with the first embodiment as shown in FIGS. 3A and 3B is preferred. For example, the load is approximately 0.5 N when an Au wire having a diameter of 25 μmΦ is wire-bonded onto an Au pad, but the load is approximately 5 N when an Al wire having a diameter of 250 μmΦ is bonded onto an Al pad. In this manner, between wires of different types and diameters, the pressure to be applied onto one of the pads is ten times higher or smaller than the pressure to be applied onto the other one.

A high-power semiconductor device that is to be used for a converter, an inverter, or a switch of a switching regulator is required to have a breakdown voltage 2.5 times higher than the voltage to be applied. Therefore, when used with the alternate current of 100 V in Japan, the breakdown voltage should be 250 V or higher. When used with the alternate current of 240 V in other countries, the breakdown voltage should be 600 V or higher. Accordingly, the breakdown voltage of a semiconductor device for high-power application should be 250 V or higher, more preferably, 600 V or higher.

The breakdown voltage expected in a semiconductor device for high-power application is a drain breakdown voltage in the case of a FET, and a collector breakdown voltage in the case of a bipolar transistor or an insulating-gate bipolar transistor.

Although the compound semiconductor layer 12 is a GaN-based semiconductor layer in the first embodiment, it may also be applied to a GaAs-based semiconductor layer. In a semiconductor device that involves GaAs, an Au interconnection layer is commonly used. In a case where an Al wire is to be wire-bonded, the pad structure in accordance with the first embodiment is preferred. Accordingly, the compound semiconductor layer 12 should preferably be a III-V compound semiconductor layer.

In a case where a GaN-based semiconductor layer is employed, the source electrodes 50 and the drain electrodes 52 may be made of Al/Ta (tantalum), Al/Pd (palladium)/Ta, or Mo(molybdenum)/Ta, with each of the materials on the left-hand side being the top layer of each electrode. The gate electrodes 54 may be made of (Au, Cu(copper), or Al)/TiWN, or (Au, Cu, or Al)/(TiWN or Pd)/(Ni, Ti, or Ir(iridium)), with each of the materials on the left-hand side being the top layer of each electrode. The electrodes to be formed on a compound semiconductor layer are not limited to those materials, but Au interconnection layers are often employed when some of the electrodes contain Au. Therefore, the electrodes formed on a compound semiconductor layer should preferably contain Au.

Second Embodiment

Figure 4:
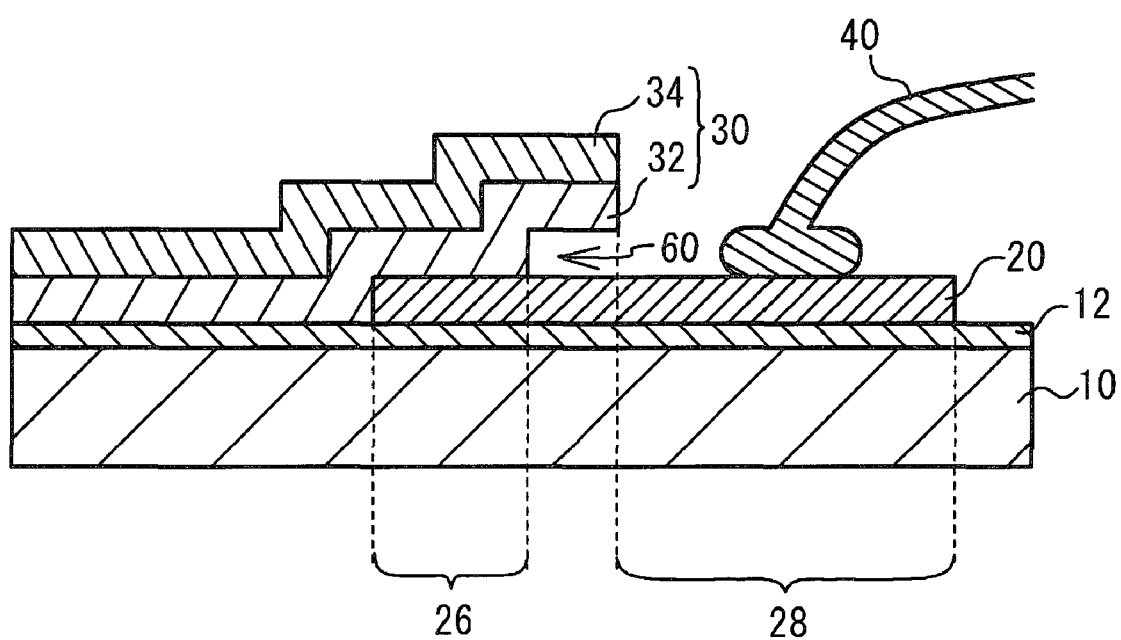
FIG. 4 is a cross-sectional view of a pad structure in accordance with a second embodiment.

FIG. 4 shows a pad structure in accordance with a second embodiment of the present invention. As shown in FIG. 4, in the second embodiment, the interconnection layer 30 does not contact the Al pad 20 at the end portion of the interconnection layer 30 on the Al pad 20 (the end portion being located between the bonding area 28 and the interconnection portion 26). The other aspects of the structure are the same as those of the first embodiment shown in FIG. 3B, and therefore, explanation of them is omitted here. As in the second embodiment, the interconnection layer 30 does not contact the Al pad 20 at the end portion of the interconnection layer 30.

Third Embodiment

Figure 5A:
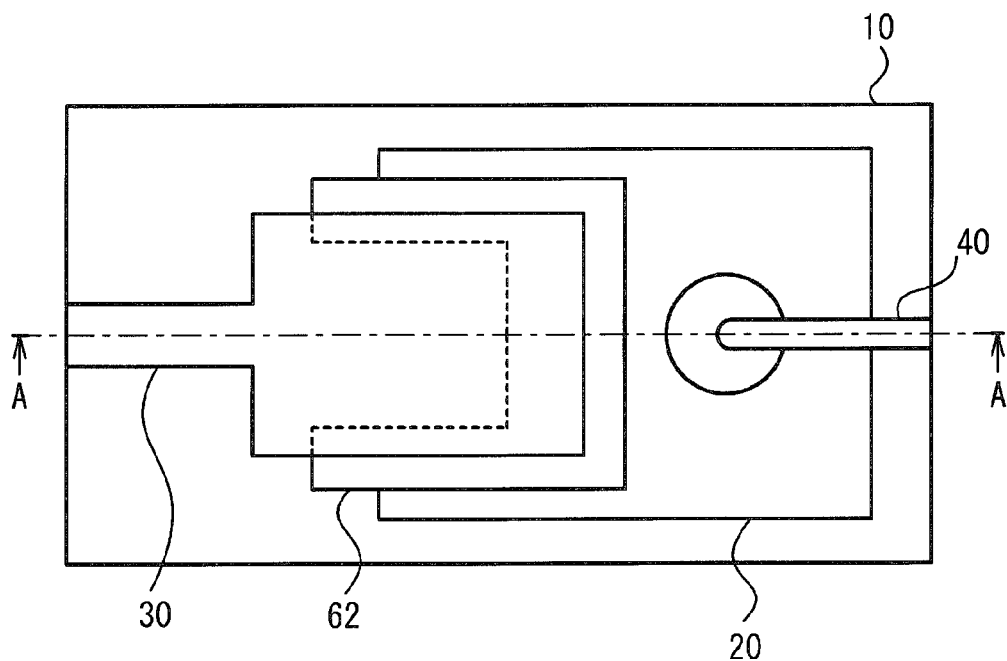
FIG. 5A is a plan view of a pad structure in accordance with a third embodiment.
Figure 5B:
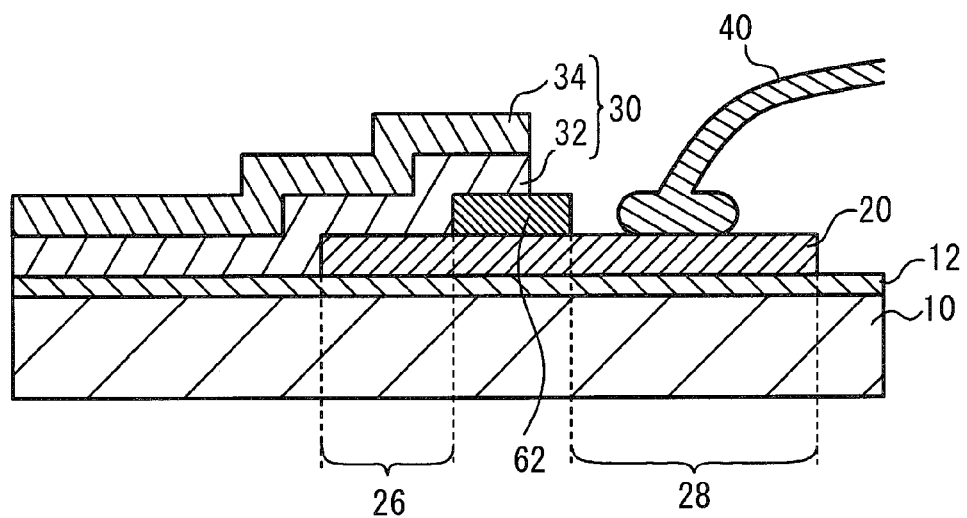
FIG. 5B is a cross-sectional view of the pad structure, taken along the line A-A of FIG. 5A.

FIGS. 5A and 5B show a pad structure in accordance with a third embodiment of the present invention. As shown in FIGS. 5A and 5B, in the third embodiment, a first insulating layer 62 made of silicon oxide or silicon nitride, for example, is provided between the interconnection layer 30 and the Al pad 20 at the end portion of the interconnection layer 30 on the Al pad 20 (the end portion being located between the bonding area 28 and the interconnection portion 26). The other aspects of the structure are the same as those of the first embodiment shown in FIGS. 3A and 3B, and therefore, explanation of them is omitted here. In accordance with the third embodiment, it is possible to prevent contact between Au and Al at the end portion of the interconnection layer 30 on the Al pad 20 during the manufacture. Further, Au or Al moves along the surface of the barrier layer 32 by virtue of the ion migration caused during an operation of the semiconductor device. Accordingly, a reaction between Au and Al can be prevented.

Fourth Embodiment

Figure 6A:
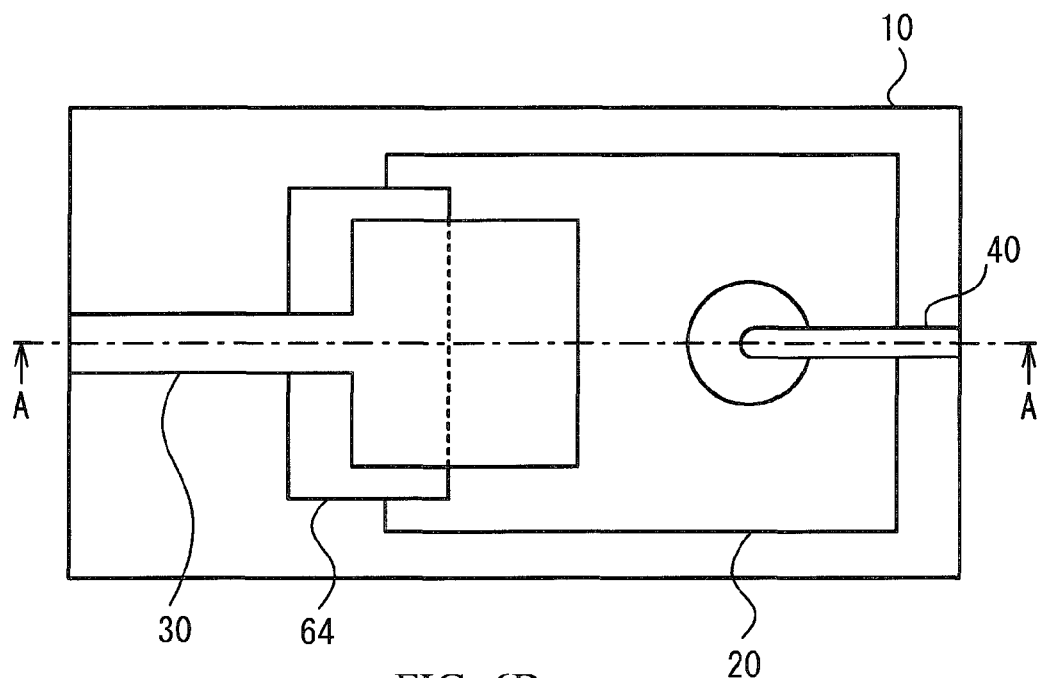
FIG. 6A is a plan view of a pad structure in accordance with a fourth embodiment.
Figure 6B:
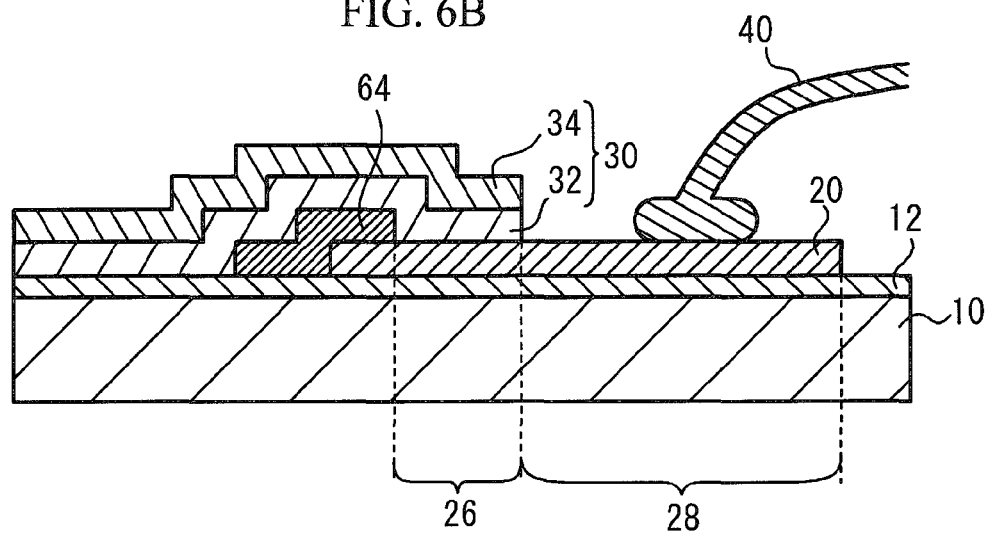
FIG. 6B is a cross-sectional view of the pad structure, taken along the line A-A of FIG. 6A.

FIGS. 6A and 6B show a pad structure in accordance with a fourth embodiment of the present invention. As shown in FIGS. 6A and 6B, in the fourth embodiment, a second insulating layer 64 is provided between the interconnection layer 30 and the Al pad 20 at the end portion of the Al pad 20. The other aspects of the structure are the same as those of the first embodiment shown in FIGS. 3A and 3B, and therefore, explanation of them is omitted here. At the step portion where the interconnection layer 30 extends onto the Al pad 20, a reaction between Au and Al might be caused due to degraded barrier properties of the barrier layer 32 or the like. In accordance with the fourth embodiment, it is possible to prevent a reaction between Au and Al at the end portion of the Al pad 20.

Fifth Embodiment

Figure 7A:
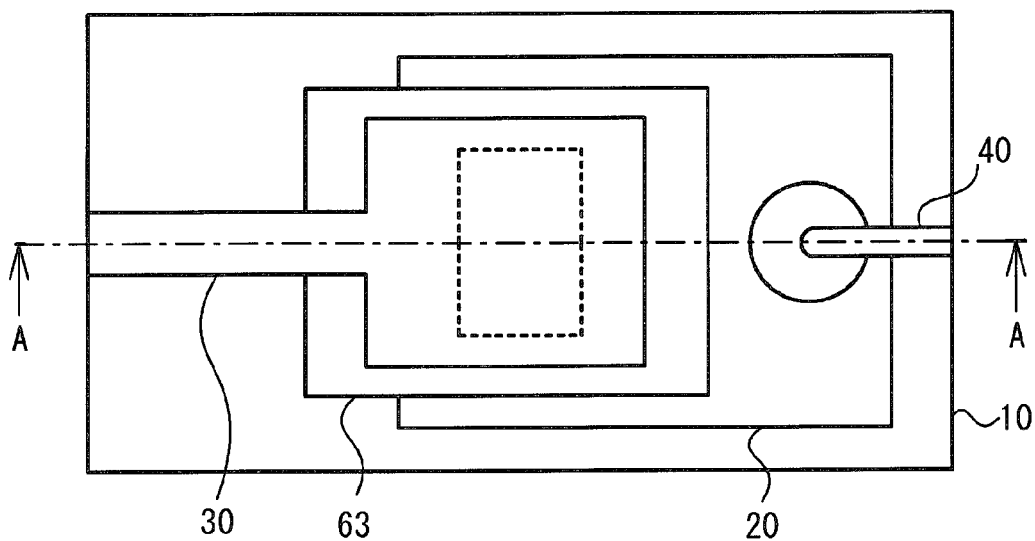
FIG. 7A is a plan view of a pad structure in accordance with a fifth embodiment.
Figure 7B:
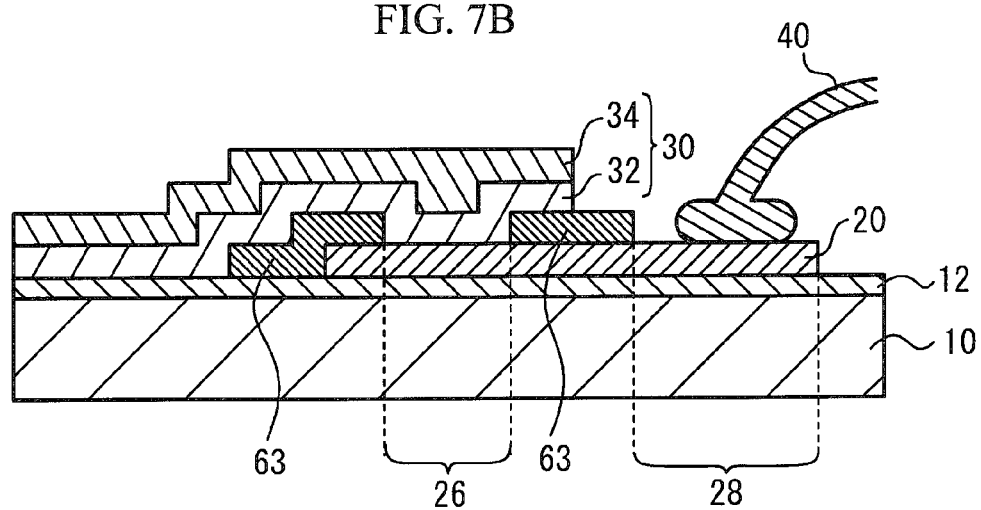
FIG. 7B is a cross-sectional view of the pad structure, taken along the line A-A of FIG. 7A.

FIGS. 7A and 7B show a pad structure in accordance with a fifth embodiment of the present invention. As shown in FIGS. 7A and 7B, in the fifth embodiment, an insulating layer 63 is formed with the first insulating layer of the third embodiment and the second insulating layer of the fourth embodiment, and has a ring-like shape. The other aspects of the structure are the same as those of the first embodiment shown in FIGS. 3A and 3B, and therefore, explanation of them is omitted here. In accordance with the fifth embodiment, it is possible to prevent a reaction between Au and Al at the overlapping portions of the interconnection layer 30 located at the end portion of the interconnection layer 30 and the end portion of the Al pad 20.

Sixth Embodiment

Figure 8:
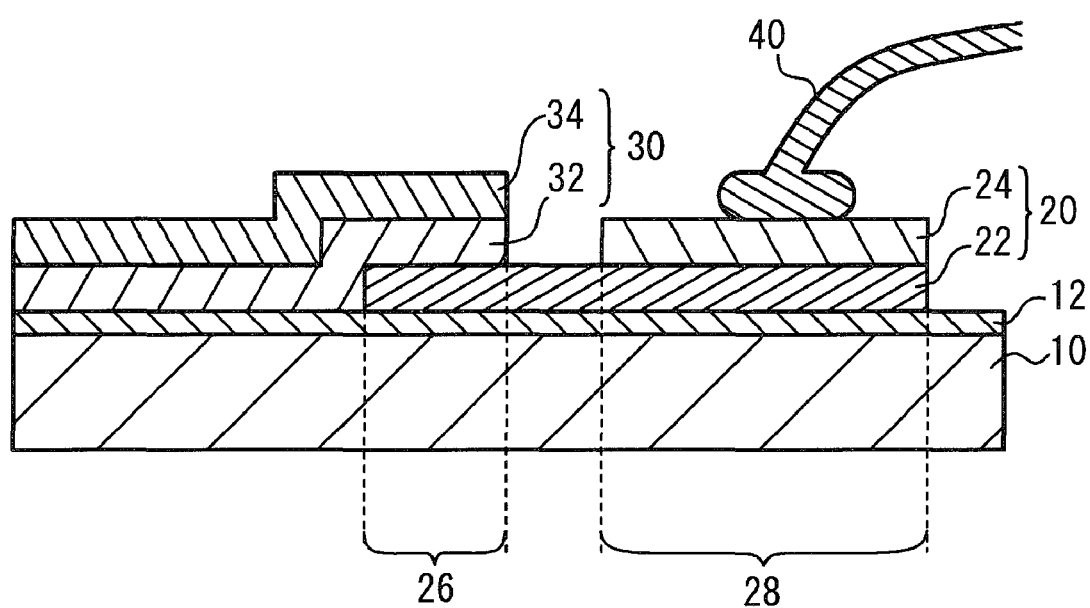
FIG. 8 is a cross-sectional view of a pad structure in accordance with a sixth embodiment.

FIG. 8 shows a pad structure in accordance with a sixth embodiment of the present invention. As shown in FIG. 8, in the sixth embodiment, the Al pad 20 is formed with a first layer 22 made of Al, and a second layer 24 made of Al on the first layer 22. The interconnection layer 30 extends onto the first layer 22, and is connected to the Al pad 20 accordingly. The Al wire 40 is connected onto the second layer 24. The other aspects of the structure are the same as those of the first embodiment shown in FIG. 3B, and therefore, explanation of them is omitted here. The film thickness of the Al pad 20 should preferably be 2 μm or greater, so as to maintain the adhesion strength between the Al wire 40 and the Al pad 20. If the film thickness of the Al pad 20 is large, a reaction between Au and Al is easily caused at the overlapping portion of the interconnection layer 30 at the end portion of the Al pad 20, as described in the fourth embodiment. In accordance with the sixth embodiment, the film thickness of the first layer 22 is made smaller, so as to reduce the size of the step portion located at the overlapping portion of the interconnection layer 30 located at the end portion of the Al pad 20. In this manner, a reaction between Al and Au can be prevented. Meanwhile, the second layer 24 is made thicker, so as to maintain the adhesion strength between the Al wire 40 and the Al pad 20.

Seventh Embodiment

Figure 9A:
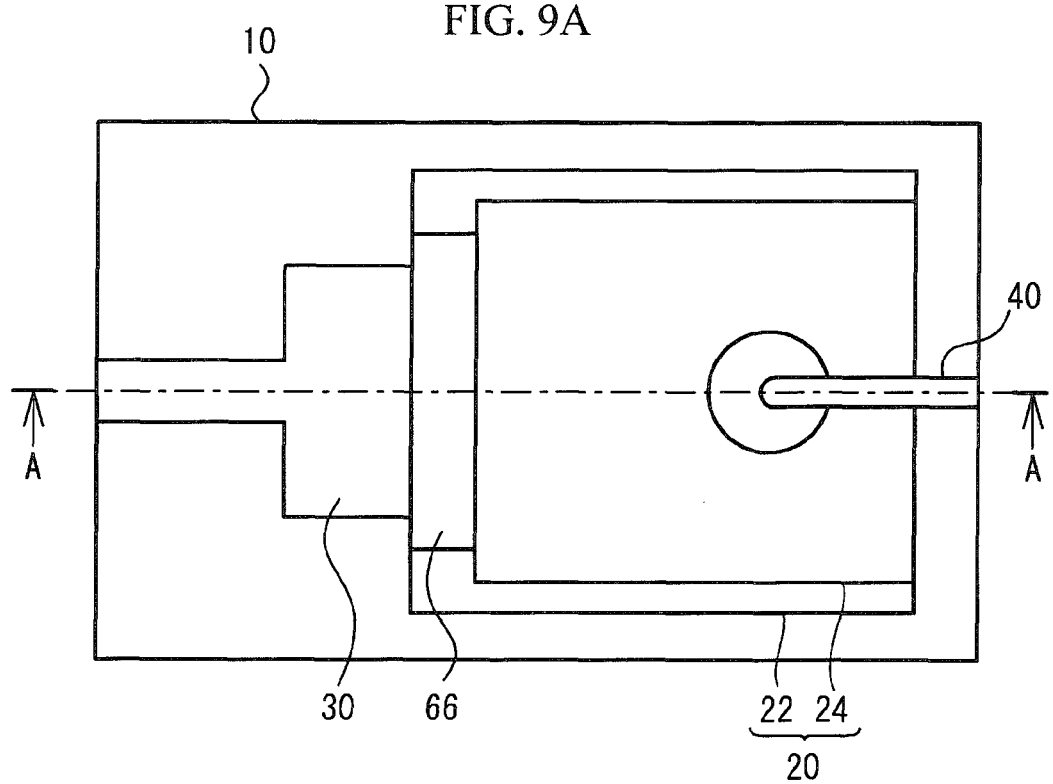
FIG. 9A is a plan view of a pad structure in accordance with a seventh embodiment.
Figure 9B:
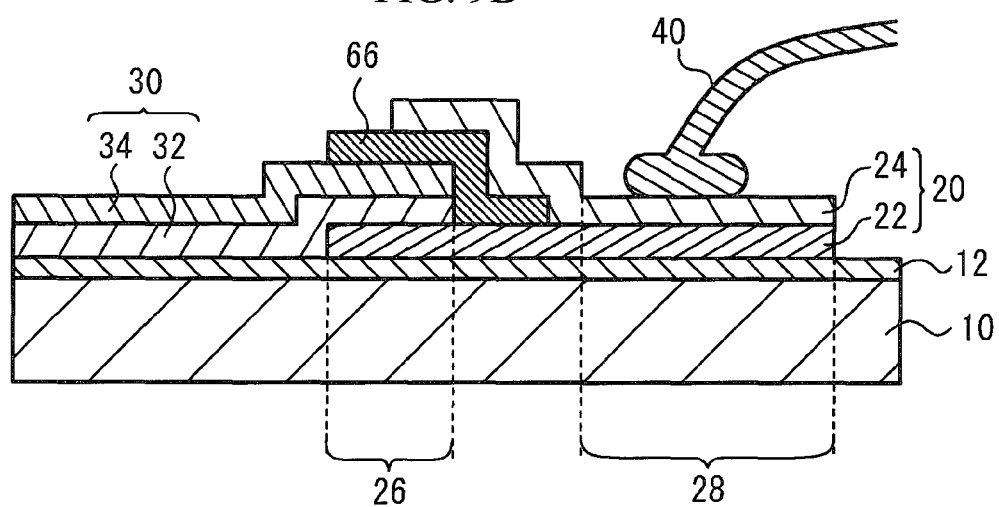
FIG. 9B is a cross-sectional view of the pad structure, taken along the line A-A of FIG. 9A.

FIGS. 9A and 9B show a pad structure in accordance with a seventh embodiment of the present invention. As shown in FIGS. 9A and 9B, in the seventh embodiment, the second layer 24 extends onto the interconnection layer 30, with a third insulating film 66 being interposed in between. The other aspects of the structure are the same as those of the sixth embodiment shown in FIGS. 8A and 8B, and therefore, explanation of them is omitted here. In accordance with the seventh embodiment, the third insulating layer 66 and the second layer 24 cover the end portion of the interconnection layer 30. Accordingly, the Al wire 40 is not brought into contact with the interconnection layer 30.

Eighth Embodiment

Figure 10A:
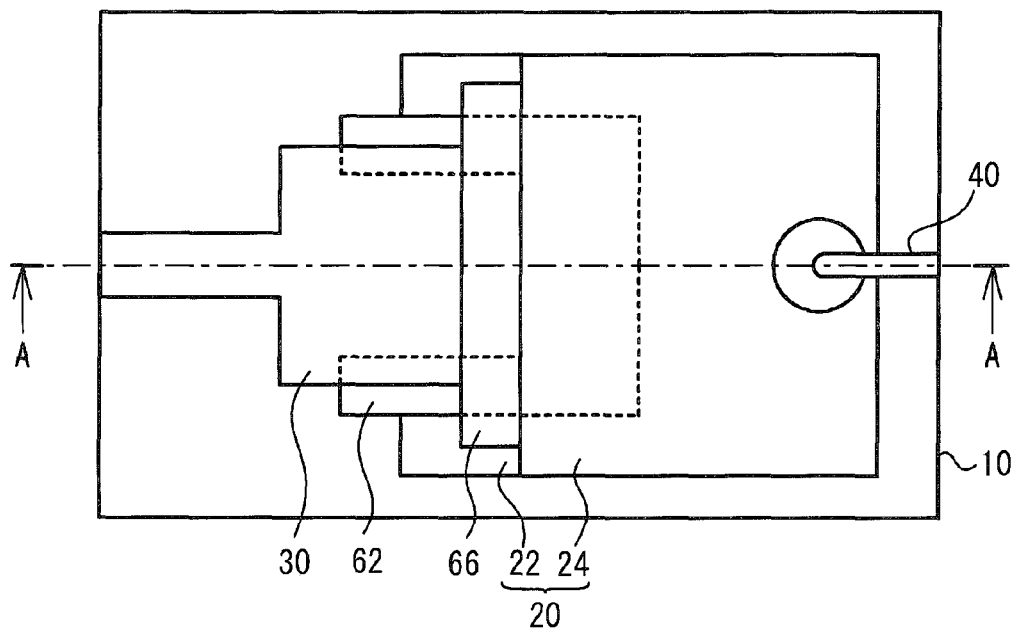
FIG. 10A is a plan view of a pad structure in accordance with an eighth embodiment.
Figure 10B:
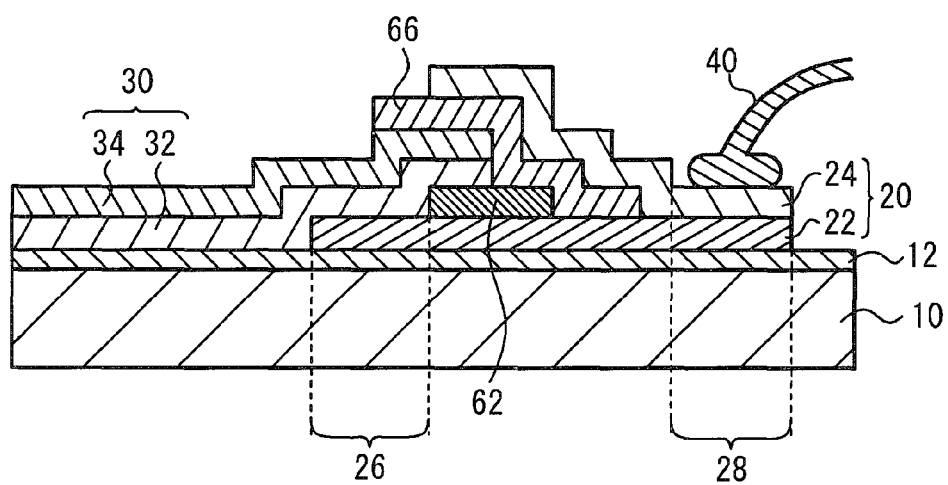
FIG. 10B is a cross-sectional view of the pad structure, taken along the line A-A of FIG. 10A.

FIGS. 10A and 10B show a pad structure in accordance with an eighth embodiment of the present invention. As shown in FIGS. 10A and 10B, in the eighth embodiment, the first insulating layer 62 is provided between the interconnection layer 30 and the first layer 22 at the end portion of the interconnection layer 30 on the first layer 22. The other aspects of the structure are the same as those of the seventh embodiment shown in FIGS. 9A and 9B, and therefore, explanation of them is omitted here. In accordance with the eighth embodiment, the first insulating layer 62 prevents a reaction between Au and Al at the end portion of the interconnection layer 30 on the first layer 22. Also, the third insulating layer 66 and the second layer 24 prevent contact of the Al wire 40 with the interconnection layer 30.

Ninth Embodiment

Figure 11:
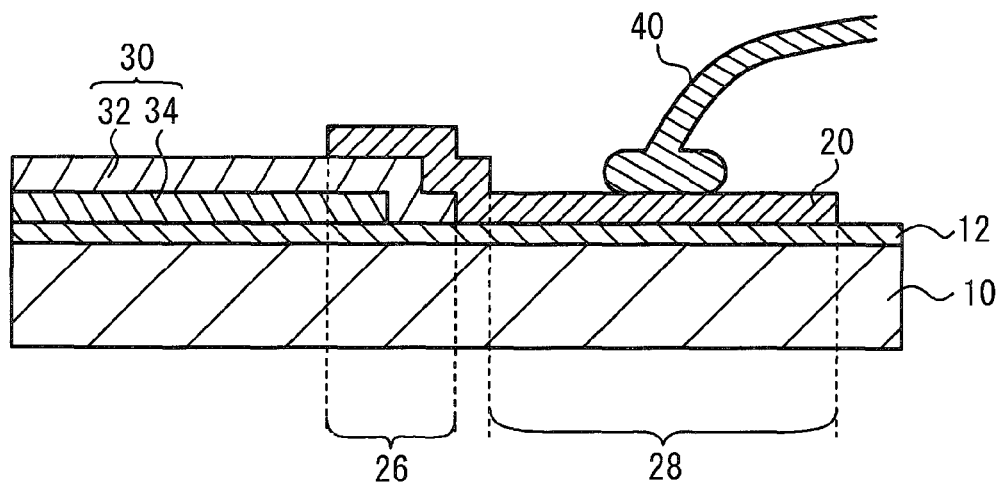
FIG. 11 is a cross-sectional view of a pad structure in accordance with a ninth embodiment.

FIG. 11 shows a pad structure in accordance with a ninth embodiment of the present invention. As shown in FIG. 11, in the ninth embodiment, the Al pad 20 extends onto the interconnection layer 30, and is connected to the interconnection layer 30 accordingly. The interconnection layer 30 has the barrier layer 32 formed on the Au layer 34. In this structure, the barrier layer 32 is provided between the Au layer 34 and the Al pad 20. The other aspects of the structure are the same as those of the first embodiment shown in FIG. 3B, and therefore, explanation of them is omitted here.

Tenth Embodiment

Figure 12:
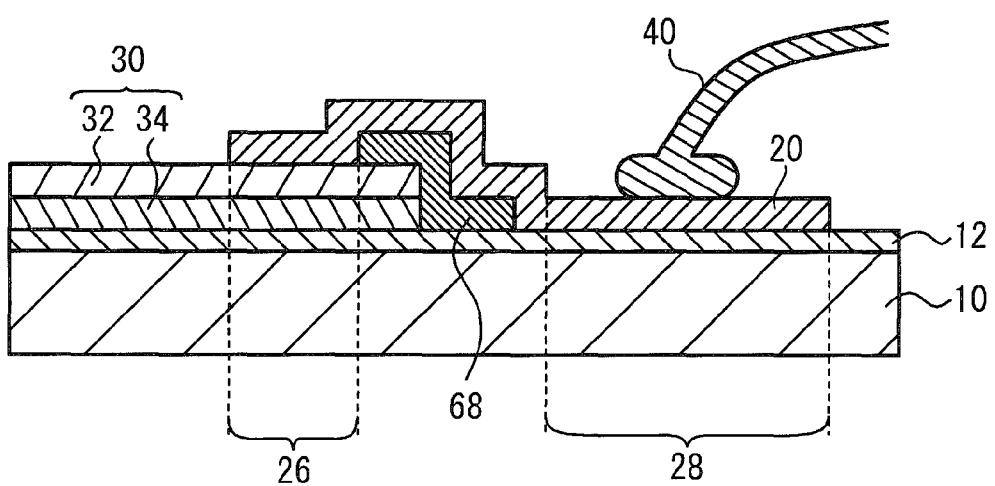
FIG. 12 is a cross-sectional view of a pad structure in accordance with a tenth embodiment.

FIG. 12 shows a pad structure in accordance with a tenth embodiment of the present invention. As shown in FIG. 12, in the tenth embodiment, a fourth insulating layer 68 is provided between the interconnection layer 30 and the Al pad 20 at the end portion of the interconnection layer 30. The other aspects of the structure are the same as those of the ninth embodiment shown in FIG. 11, and therefore, explanation of them is omitted here. In accordance with the tenth embodiment, the fourth insulating layer 68 prevents a reaction between Al and Au at the end portion of the interconnection layer 30.

In a FET containing GaN, the source electrodes 50 and the drain electrodes 52 are typically electrodes made of materials including Al, such as Al/Ti. In accordance with the first through eighth embodiments, the Al pad 20 can be formed at the same time as the formation of the Al-containing electrodes. In a case where Al-containing electrodes are not employed, the interconnection layer 30 may be formed after the Al pad 20 is formed. However, as in the ninth embodiment and the tenth embodiment, the Al pad 20 can be formed after the interconnection layer 30 is formed. Accordingly, in either a case where Al-containing electrodes are employed or a case where Al-containing electrodes are not employed, it is possible to select any of the structures in accordance with the first through eighth embodiments or either of the structures in accordance with the ninth and tenth embodiments.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present application is based on Japanese Patent Application No. 2007-075858 filed on Mar. 23, 2007, the entire disclosure of which is hereby incorporated by reference.

What is claimed is:

1. A semiconductor device, comprising:
   an Al pad that is formed on a semiconductor layer and has a bonding area and an interconnection portion;
   an interconnection layer that has a Au layer and a barrier layer and is electrically connected to the interconnection portion of the Al pad, an edge of the interconnection layer being formed outside of the bonding area, the barrier layer being provided in contact with the interconnection portion of the Al pad, and the interconnection layer not overlapping with the bonding area of the Al pad;
   an Al bonding wire being provided in direct contact with the bonding area of the Al pad by forming the Al bonding wire on the Al pad, a diameter of the Al bonding wire being equal to or greater than 100 μm; and
   a first insulating layer that is provided between the interconnection layer and the Al pad at an end portion of the interconnection layer.

2. The semiconductor device as claimed in claim 1, wherein the barrier layer contains one of TiN, TiWN, WN, WSiN, and TaN.

3. The semiconductor device as claimed in claim 1, wherein a thickness of the barrier layer is 100 nm to 200 nm.

4. The semiconductor device as claimed in claim 1, wherein a maximum service temperature of the semiconductor device is 200° C. or higher.

5. A semiconductor device, comprising:
- an Al pad that is formed on a semiconductor layer and has a bonding area and an interconnection portion;
- an interconnection layer that has a Au layer and a barrier layer and is electrically connected to the interconnection portion of the Al pad, an edge of the interconnection layer being formed outside of the bonding area, the barrier layer being provided in contact with the interconnection portion of the Al pad, and the interconnection layer not overlapping with the bonding area of the Al pad;
- an Al bonding wire being provided in direct contact with the bonding area of the Al pad by forming the Al bonding wire on the Al pad, a diameter of the Al bonding wire being equal to or greater than 100 µm; and
- a second insulating layer that is provided between the interconnection layer and the Al pad at an end portion of the Al pad.

6. The semiconductor device as claimed in claim 5, wherein a maximum service temperature of the semiconductor device is 200° C. or higher.

7. The semiconductor device as claimed in claim 5, wherein the barrier layer contains one of TiN, TiWN, WN, WSiN, and TaN.

8. The semiconductor device as claimed in claim 5, wherein a thickness of the barrier layer is 100 nm to 200 nm.

9. A semiconductor device, comprising:
- an Al pad that is formed on a semiconductor layer and has a bonding area and an interconnection portion;
- an interconnection layer that has a Au layer and a barrier layer and is electrically connected to the interconnection portion of the Al pad, an edge of the interconnection layer being formed outside of the bonding area, the barrier layer being provided in contact with the interconnection portion of the Al pad, and the interconnection layer not overlapping with the bonding area of the Al pad; and
- an Al bonding wire being provided in direct contact with the bonding area of the Al pad by forming the Al bonding wire on the Al pad, a diameter of the Al bonding wire being equal to or greater than 100 µm; wherein:
- the Al pad is formed with a first layer and a second layer formed on the first layer;
- the interconnection layer extends onto the first layer, so as to be connected to the Al pad; and
- the bonding area is formed in the second layer.

10. The semiconductor device as claimed in claim 9, wherein a maximum service temperature of the semiconductor device is 200° C. or higher.

11. The semiconductor device as claimed in claim 9, wherein the barrier layer contains one of TiN, TiWN, WN, WSiN, and TaN.

12. The semiconductor device as claimed in claim 9, wherein a thickness of the barrier layer is 100 nm to 200 nm.

13. A semiconductor device, comprising:
- an Al pad that is formed on a semiconductor layer and has a bonding area and an interconnection portion;
- an interconnection layer that has a Au layer and a barrier layer and is electrically connected to the interconnection portion of the Al pad, an edge of the interconnection layer being formed outside of the bonding area, the barrier layer being provided in contact with the interconnection portion of the Al pad, and the interconnection layer not overlapping with the bonding area of the Al pad; and
- an Al bonding wire being provided in direct contact with the bonding area of the Al pad by forming the Al bonding wire on the Al pad, a diameter of the Al bonding wire being equal to or greater than 100 µm; wherein
- the Al pad is formed with a first layer and a second layer formed on the first layer;
- the interconnection layer extends onto the first layer, so as to be connected to the Al pad;
- the bonding area is formed in the second layer; and
- the second layer extends onto the interconnection layer, with a third insulating layer being interposed in between.

14. The semiconductor device as claimed in claim 13, wherein a maximum service temperature of the semiconductor device is 200° C. or higher.

15. The semiconductor device as claimed in claim 13, wherein the barrier layer contains one of TiN, TiWN, WN, WSiN, and TaN.

16. The semiconductor device as claimed in claim 13, wherein a thickness of the barrier layer is 100 nm to 200 nm.

* * * * *